(12) United States Patent
Osterried

(10) Patent No.: US 6,829,107 B2
(45) Date of Patent: Dec. 7, 2004

(54) DEVICE FOR MOUNTING AN OPTICAL ELEMENT, FOR EXAMPLE A LENS ELEMENT IN A LENS

(75) Inventor: Karlfrid Osterried, Aalen (DE)

(73) Assignee: Carl-Zeiss-Stiftung (DE)

( * ) Notice: Subject to any disclaimer, the term of this patent is extended or adjusted under 35 U.S.C. 154(b) by 303 days.

(21) Appl. No.: 09/882,564

(22) Filed: Jun. 15, 2001

(65) Prior Publication Data

US 2002/0021503 A1 Feb. 21, 2002

(30) Foreign Application Priority Data

Jun. 17, 2000 (DE) .......................................... 100 30 004
May 30, 2001 (EP) .............................................. 01113149

(51) Int. Cl.⁷ ................................................. G02B 7/02
(52) U.S. Cl. ...................... 359/811; 359/812; 359/813; 359/815; 359/816; 359/819
(58) Field of Search .................................. 359/811, 812, 359/813, 815, 816, 819, 827, 822

(56) References Cited

U.S. PATENT DOCUMENTS 4,662,717 A * 5/1987 Yamada et al. ............. 359/362

FOREIGN PATENT DOCUMENTS

DE          3730094 A1    12/1988
WO       WO 99/40469    *  8/1999

* cited by examiner

Primary Examiner—Georgia Epps
Assistant Examiner—Tim Thompson
(74) Attorney, Agent, or Firm—Wells St. John P.S.

(57) ABSTRACT

A device for mounting an optical element (1), for example for a lens element in a lens, especially in an exposure lens (2) in micro lithography, is provided with the following features:

the optical element (1) is provided in its edge zone with support points (8, 9, 10). Counterbearing points (11) are disposed opposite the support points (8, 9, 10) of the optical element (1) in an outer mounting (3). Bearing members (12) are disposed between the support points (8, 9, 10) and the counterbearing points (11). The bearing members (12) are provided with spherical surfaces directed toward the support points (8, 9, 10).

34 Claims, 2 Drawing Sheets

DEVICE FOR MOUNTING AN OPTICAL ELEMENT, FOR EXAMPLE A LENS ELEMENT IN A LENS

This application relates to and claims priority to corresponding German Patent Application No. 100 30 004.9 filed on Jun. 17, 2000, and corresponding European Patent Application No. 01113149.7 filed on May 30, 2001.

BACKGROUND OF THE INVENTION

The invention relates to a device for mounting an optical element, for example a lens element in a lens, especially in an exposure lens in micro lithography.

Optical elements, especially lens elements, are generally mounted in what is known as a directional adhesive bonding mounting or inner mounting, which in turn is connected to an outer mounting. Mechanical distorting stresses may be applied to the optical element by the directional adhesive bonding mounting which impair the imaging accuracy of the optical element. In lenses for micro lithography, what are known as corrective elements, for example lens elements, are known which are designed for replacement in a lens in order to correct or eliminate residual optical errors.

In a replacement of an optical element, for example a corrective lens, and subsequent reinstallation or installation of a different optical element, new errors, especially installation errors, may creep in.

Furthermore, it is often necessary to align optical elements, in particular lens elements, which are situated at a directional adhesive bonding point for installation, with their optical axes at right angles to the mounting of the lens.

It is therefore an object of the present invention to provide a device of the type mentioned initially which applies no distorting stresses to the optical element and which also ensures that, when the optical element is replaced and reinstallation takes place, no new errors Iran arise or a reproducible reinstallation is achieved.

It is a further object of the invention at the same time to provide for tilting adjustment or precise setting adjustment of the optical element during installation or following removal and refitting.

SUMMARY OF THE INVENTION

This object is achieved, according to the invention, by the features mentioned in claim 1.

According to the invention, the optical element now simultaneously takes on the function of an inner mounting or the latter is integrated into the optical element. To this end, it is merely necessary to provide a corresponding edge zone with support points, for which purpose it a generally merely necessary to enlarge the diameter of the optical element slightly.

As a result of the precise assignment of the support points and the counterbearing points, not only is reproducibility during installation and removal achieved but, an addition, there are also no mechanical distorting stresses because of the absence of directional adhesive bonding points.

In an advantageous embodiment of the invention, provision may be made for the edge zone of the optical element with the support points to form at least approximately a flat surface, whereby good reproducibility can be achieved.

In a very advantageous embodiment of the invention, provision may be made for the support points, the counterbearing points and the bearing members to form a three-point bearing with a planar support, a groove-shaped support and a fixed-point support.

In a very advantageous embodiment of the invention, provision may be made, in order to set a tilting adjustment during installation for the support points, which are formed, for example, by V-shaped channels or grooves, to lie at an angle with respect to a plane which lies at right angles to the z axis. This is generally the horizontal plane. In addition to providing improved centering of the optical element, this embodiment makes it possible, by simple lateral displacement of the support points (one or more) in the radial direction, to change the height of the optical element at this point, with the result that, on account of a change in height of the bearing points on the optical element, the latter is tilted The resolution can be set by selecting the angle of inclination, with the result that the tilting can be corrected for down to very low values.

The above adjustment method, if necessary, can be employed even during installation, without any dismantling of the support feet being required. In this way, a corresponding amount of time is saved.

In another embodiment, it is possible to provide for the bearing points to be formed by V-shaped grooves or channels, with the longitudinal walls of the grooves or channels at an angle to one another.

Normally, the channel walls run parallel to one another. If, according to the invention, these walls are now arranged at an angle to one another, it is possible, by radial displacement of a supper point, once again to effect tilting of the optical element. As a result of a corresponding displacement, the penetration depth of the bearing bodies changes and therefore so does the z height of the support point.

If, in an alternative solution, the counterbearing points at which the bearing bodies are arranged lie at an angle to a plane which is at right angles to the z axis, in general at an angle to the horizontal plane, a radial displacement of the support points on the inclined mounting also changes the height position of the support point of the bearing body on the optical element accordingly. In this way, tilting is once again generated. The resolution can then be set by means of the angle. Naturally, the same angle has then to be provided on the outer mounting.

BRIEF DESCRIPTION OF THE DRAWINGS

Advantageous refinements and embodiments are apparent from the remaining dependent claims and from the examples of embodiment described below with reference to the drawing, in which:

DETAILED DESCRIPTION OF THE PREFERRED EMBODIMENTS

Figure 1:
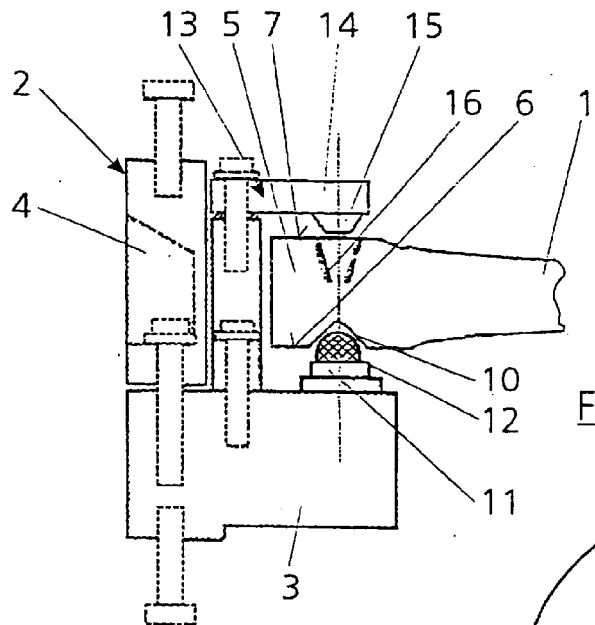
FIG. 1 shows a lateral view of the device according to the invention.

In the examples of embodiment that follow, a lens element 1, for example a corrective lens, is used as an optical element to explain the device according to the invention. The device can of course also be used for other optical elements, such as for example flat optical panels, prisms or elements which, for example, influence the polarization or intensity distribution. A preferred field of application here is an exposure lens 2 in micro lithography. In FIG. 1, for the purposes of simplification, all that is shown is part of an exposure lens 2 with an outer mounting 3 and an adapter ring 4 connected thereto, The adapter ring 4 is in turn connected via screws to an outer mounting disposed thereon (not shown).

The lens element is provided with a widened edge zone 5 which possesses a flat surface on its bottom 6 and on its top 7. Three support points are provided in the lower flat surface 6, distributed over the circumference, specifically a planar support 8, a groove-shaped support 9 and a fixed-point support 10. The fixed-point support 10 is formed by a conical cutout, as can be seen in FIG. 1.

Arranged in a correspondingly assigned manner in the outer mounting 3 are three counterbearing points 11, which are provided with bearing members 12 which are designed as balls or at least each have a spherical surface directed toward the support points 8, 9 and 10.

Figure 2:
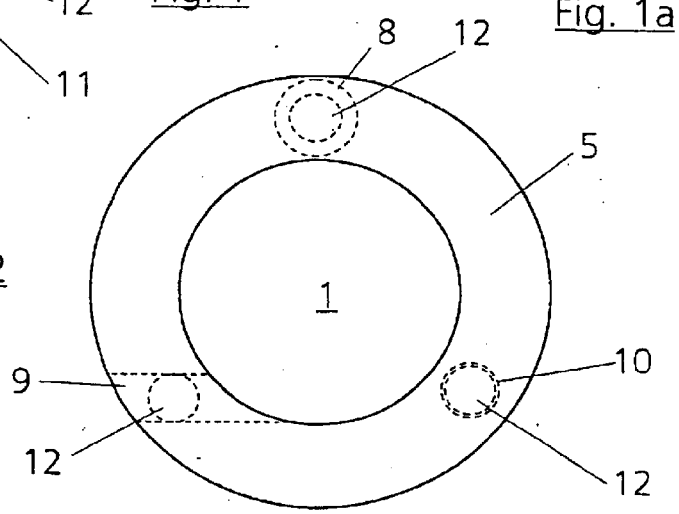
FIG. 2 shows a plan view of the optical element shown in FIG. 1, on a reduced scale.

As is apparent from FIGS. 1 and 2, a three-point bearing is formed in this manner, as a result of which the lens element is exactly positioned, so that after removal has taken place it can be reinserted accurately and hence reproducibly.

As is apparent from FIG. 2, the extension of the longitudinal axis of the groove-shaped support 9 runs through the fixed-point support 10, which is formed by a conical receiving part (FIG. 1). In this manner, very precise reproducibility of the support is achieved.

A high reproducibility of the bearings can be achieved by the use of hard metal elements.

As a rule, lenses in micro lithography are not tilted and also do not turn over. For this reason, no special fixing would be necessary per se For safety reasons, however, it is additionally possible to provide a securing device 13 which is provided to prevent the lens element 1 from being roughly displaced or falling out. An important point here, however, is that no force transmission by the securing device 13 to the optical element 1, in this case to the lens element, takes place. This can be achieved, for example, by an air gap of a few $\mu$m or by an adhesive layer, which must, however, exert no pressure. To this end, the securing device 13 is provided with an extension arm 14 from which a securing member 15 is directed toward the upper flat surface 7 of the lens element 1.

Figure 1A:
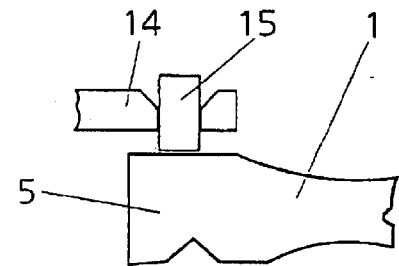
FIG. 1a shows a detail of FIG. 1 of a different embodiment of a securing device.

For precise distance setting and in order to achieve freedom from forces, the securing member 15 is adjustable in the direction of the z axis or of the optical axis. As a securing member 15, for example, conical, frustoconical, spherical or cylindrical members are possible. FIG. 1a shows a cylindrical member as a securing member 15, which is moveable in the direction toward the lens element 1 and, after precise setting of distance, is then fixed to the extension arm 14, for example by means of a screw or adhesive.

In order to isolate the working zone of the lens element 1 from mechanical stresses resulting, for example, from the bonding to the securing device 13 or from differences in thermal expansion between the lens element 1 and the securing device 13, relief grooves 16 can be made in the Supper flat surface 7 and/or in the lower flat surface 6. The relief grooves 16 are, as is apparent, provided in the edge zone, and it is generally sufficient if they are located only in the circumferential sections in which the support points 8, 9 and 10 are located. The relief grooves 16 may extend in toe vertical direction or, alternatively, obliquely or at an angle to the z axis.

Figure 3:
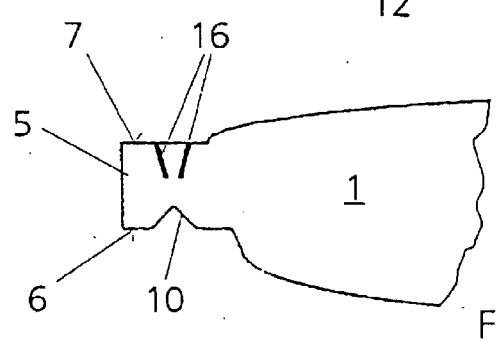
FIG. 3 shows a lateral view of an optical element, specifically a lens element, in a raised or convex form with the embodiment according to the invention.
Figure 4:
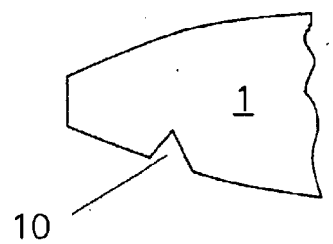
FIG. 4 shows a lateral view of an optical element, specifically a lens element, in a raised or convex form with the embodiment according to the invention, support points being machined directly into the lens element surface.
Figure 5:
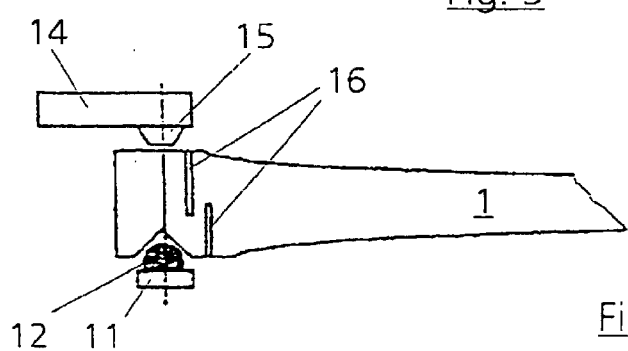
FIG. 5 shows a lens element in a concave form in an embodiment according to the invention with a support surface.

FIG. 3 shows two obliquely extending relief grooves 16 in the upper flat surface 7, and FIG. 4 shows a relief groove in the upper surface 7 and another vertical relief groove in the lower flat surface 6. As can be seen, the relief grooves according to FIG. 3 are designed concentrically as the generating line of a cone.

It should additionally be noted that the edge zones need not unconditionally be flat in extent but may also be inclined if necessary.

The upper flat surface 7 of the edge zone 5 is precision-lapped to a low microroughness in order to guarantee a mechanically measurable surface for the adjustment of the horizontal extension arm 14 or of the securing member 15.

The support points 6, 9 and 10 can be milled and reflectively polished in advance during the pre-polishing of the working surface of the optical element 1.

As can be seen, the optical element 1 no longer possesses a mounting but constitutes a loose lens element which, for example, can be removed in a simple manner as a corrective element or corrective lens.

Figure 6:
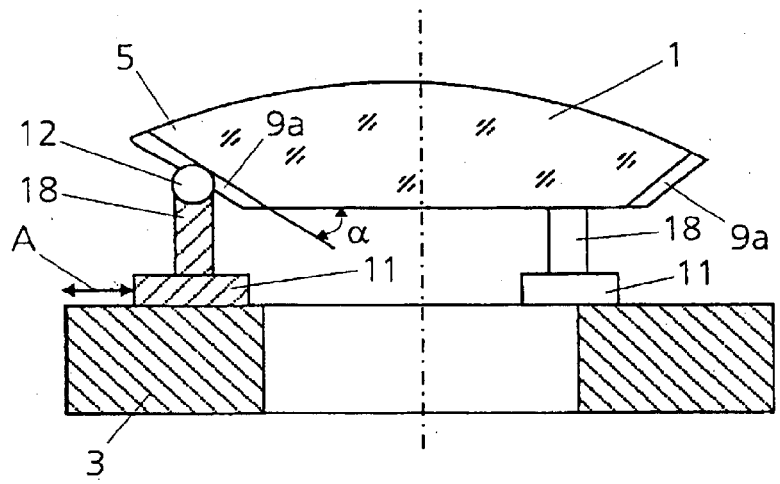
FIG. 6 shows a side view of a device for tilting adjustment, with V-shaped channels which are inclined at an angle a with respect to the horizontal plane.

FIG. 6 shows a device for a first embodiment in terms of tilting adjustment. In this case, three v-shaped channels 9a, which are arranged offset by 120° with respect to one another, are provided, arranged radially in the lens element 1, these channels being inclined at the angle $\alpha$ with respect to the z axis. In this arrangement, therefore, the inclination is oriented obliquely with respect to the horizontal plane. The further result is optimum centering of the lens element 1. By means of a single displacement of a counterbearing point 11 in the direction of the arrow A, it is possible, by means of a resultant, corresponding displacement of the bearing body 12 in the groove or the channel 9a, to set a tilt. The change in height of the support point for the lens element 1 which is achieved in this way represents a tilting of the lens element 1. The shallower the angle of inclination $\alpha$, the more precisely and sensitively the tilting can be set. If appropriate, it is also possible for the optical element, namely the lens element 1, to be displaced with respect to the support points, so that tilting is once again effected, although in this case the centering changes.

Figure 7:
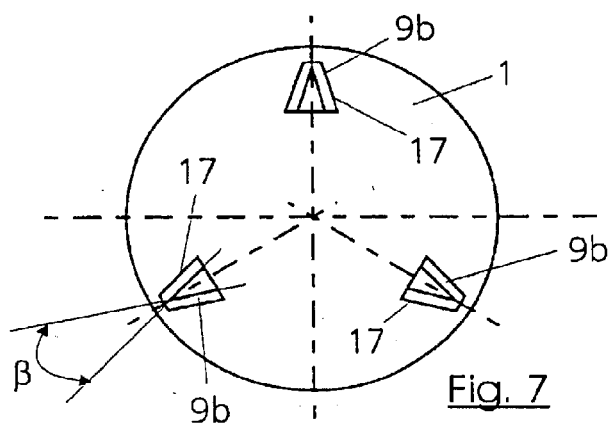
FIG. 7 shows a view from below of an optical element for a different form of tilting adjustment.
Figure 8:
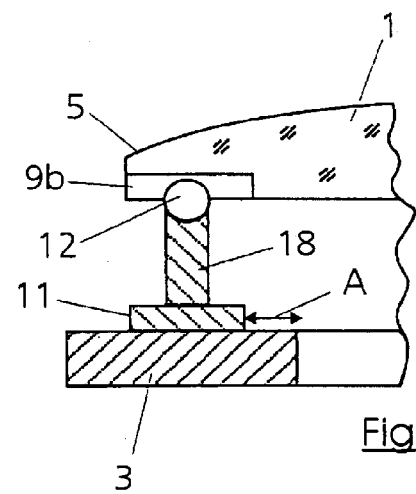
FIG. 8 shows excepts or a side view of the tilting adjustment shown in FIG. 7, partially in section.

FIGS. 7 and 8 show another embodiment for tilting adjustment. As Wan be seen from FIG. 7, in this case the longitudinal walls 17 of the V-shaped channels 9b do not run parallel to one another, but rather are arranged at an angle $\beta$ with respect to one another. As a result of radial displacement in the direction of the arrow A of the counterbearing point 11 or alternatively of the lens element 1, the penetration depth of the bearing body 12 into the corresponding V-shaped channel 9b therefore changes, with the result that a height change of the corresponding support point and therefore tilting of the optical element, namely of the lens element 1, reestablished.

Figure 9:
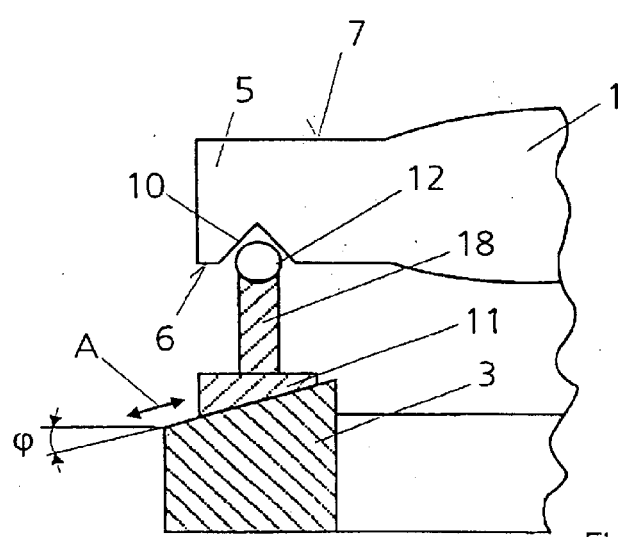
FIG. 9 shows excerpts of a side view for tilting adjustment by means of an inclined mounting.

FIG. 9 shows a tilting adjustment in which the counterbearing points 11 on which the bearing bodies 12 are arranged lie at an angle φ to the plane which is at right angles to the z axes, which in the present case represent the horizontal plane. Of course, in this case, it is also necessary for the region of the outer mounting 3, which is situated beneath the counterbearing points 11, to be at the same angle.

By means of radial displacement of the counterbearing points 11, the direction of the arrow A, along the slope, once again a corresponding change in height, and therefore a tilting adjustment of the support points for the tens element 1 on the bearing bodies 12, are achieved.

In the exemplary embodiments shown in FIGS. 6 to 9, the bearing bodies 12 are each connected to the counterbearing points 12 via an intermediate web 18. Naturally, the bearing of the bearing bodies 12 on the counterbearing points it may also be effected in different ways, in which context reference is made, for example, to FIGS. 1 to 5.

What is claimed is:

1. A device for mounting an optical element, for example a lens element in a lens, especially in an exposure lens in micro lithography, comprising the following features:
    a) the optical element is provided in its edge zone with support points,
    b) counterbearing points are disposed opposite the support points of the optical element in an outer mounting,
    c) bearing members are disposed between the support points and the counterbearing points,
    d) the bearing members are provided with spherical surfaces directed toward the support points, wherein the optical element freely rests upon the bearing members, and
    wherein the support points, the counterbearing points and the bearing members form a three-point bearing with a planar support, a groove-shaped support and a fixed-point support.

2. The device as claimed in claim 1, wherein the edge zone of the optical element with the support points possesses a at least approximately flat surface.

3. The device as claimed in claim 1, wherein the extension of the longitudinal axis of the groove-shaped support runs through the fixed-point support which is formed by a conical receiving part.

4. The device as claimed in claim 1, wherein the optical element is provided in the edge zone with relief grooves for isolating the working zone of the optical element from mechanical stresses.

5. The device as claimed in claim 1, wherein a securing device for securing in the direction of the optical axis is provided on the side of the optical element opposite the support points.

6. The device as claimed in claim 5, wherein the securing device is connected to the optical element via an adhesive bond.

7. The device as claimed in claim 5, wherein the securing device is matched, in terms of its thermal expansion, to the thermal expansion of the optical element.

8. The device as claimed in claim 5, wherein the securing device is provided with a securing member which is adjustable relative to the optical element.

9. The device as claimed in claim 1, wherein the top of the edge zone of the optical element is precision-lapped to microroughness.

10. The device as claimed in claim 1, wherein the optical element is a corrective lens in an exposure lens in micro lithography.

11. The device as claimed in claim 1, wherein the support points lie at an angle with respect to a plane which lies at right angles to the optical axis.

12. The device as claimed in claim 11, wherein the support points are formed by V-shaped grooves or channels, the longitudinal axes of which are directed toward the optical axis.

13. The device as claimed in claim 1, wherein the support points are formed by V-shaped grooves or channels, the longitudinal walls of the grooves or channels lying at an angle with respect to one another.

14. The device as claimed in claim 1, wherein the counterbearing points, by means of which the bearing bodies are connected to one another, lie at an angle with respect to a plane which lies at right angles to the optical axis.

15. The device as claimed in claim 14, wherein those sides of the counterbearing points which face toward the outer mounting run obliquely with respect to the optical axis, and wherein the outer mounting has the same inclination, at least in the regions on which the counterbearing points rest.

16. The device as claimed in claim 11, wherein the counterbearing points are displaceable in the radial direction.

17. A device for mounting an optical element, for example a lens element in a lens, especially in an exposure lens in micro lithography, comprising the following features:
    a) the optical element is provided in its edge zone with support points,
    b) counterbearing points are disposed opposite the support points of the optical element in an outer mounting,
    c) bearing members are disposed between the support points and the counterbearing points,
    d) the bearing members are provided with spherical surfaces directed toward the support points, and
    wherein the support points, the counterbearing points and the bearing members form a three-point bearing with a planar support, a groove-shaped support and a fixed-point support.

18. A device for mounting an optical element, for example a lens element in a lens, especially in an exposure lens in micro lithography, comprising the following features:
    a) the optical element is provided in its edge zone with support points,
    b) counterbearing points are disposed opposite the support points of the optical element in an outer mounting,
    c) bearing members are disposed between the support points and the counterbearing points,
    d) the bearing members are provided with spherical surfaces directed toward the support points, and
    wherein the optical element is provided in the edge zone with relief grooves for isolating the working zone of the optical element from mechanical stresses.

19. A device for mounting an optical element, for example a lens element in a lens, especially in an exposure lens in micro lithography, comprising the following features:
    a) the optical element is provided in its edge zone with support points,
    b) counterbearing points are disposed opposite the support points of the optical element in an outer mounting,
    c) bearing members are disposed between the support points and the counterbearing points,
    d) the bearing members are provided with spherical surfaces directed toward the support points, wherein the optical element freely rests upon the bearing members, and wherein a securing device for securing in the direction of the optical axis is provided on the side of the optical element opposite the support points.

20. The device as claimed in claim 19, wherein the securing device is connected to the optical element via an adhesive bond.

21. The device as claimed in claim 19, wherein the securing device is matched, in terms of its thermal expansion, to the thermal expansion of the optical element.

22. The device as claimed in claim 19, wherein the securing device is provided with a securing member which is adjustable relative to the optical element.

23. The device as claimed in claim 19, wherein the top of the edge zone of the optical element is precision-lapped to microroughness.

24. The device as claimed in claim 19, wherein the optical element is a corrective lens in an exposure lens in micro lithography.

25. The device as claimed in claim 19, wherein the support points lie at an angle with respect to a plane which lies at right angles to the optical axis.

26. The device as claimed in claim 19, wherein the support points are formed by V-shaped grooves or channels, the longitudinal walls of the grooves or channels lying at an angle with respect to one another.

27. The device as claimed in claim 19, wherein the counterbearing points, by means of which the bearing bodies are connected to one another, lie at an angle with respect to a plane which lies at right angles to the optical axis.

28. A device for mounting an optical element, for example a lens element in a lens, especially in an exposure lens in micro lithography, comprising the following features:
   a) the optical element is provided in its edge zone with support points,
   b) counterbearing points are disposed opposite the support points of the optical element in an outer mounting,
   c) bearing members are disposed between the support points and the counterbearing points,
   d) the bearing members are provided with spherical surfaces directed toward the support points, wherein the optical element freely rests upon the bearing members, and
   wherein the optical element is a corrective lens in an exposure lens in micro lithography.

29. The device as claimed in claim 28, wherein the edge zone of the optical element with the support points possesses a at least approximately flat surface.

30. The device as claimed in claim 28, wherein the extension of the longitudinal axis of the groove-shaped support runs through the fixed-point support which is formed by a conical receiving part.

31. The device as claimed in claim 28, wherein the top of the edge zone of the optical element is precision-lapped to microroughness.

32. The device as claimed in claim 28, wherein the support points lie at an angle with respect to a plane which lies at right angles to the optical axis.

33. The device as claimed in claim 28, wherein the support points are formed by V-shaped grooves or channels, the longitudinal walls of the grooves or channels lying at an angle with respect to one another.

34. The device as claimed in claim 28, wherein the counterbearing points, by means of which the bearing bodies are connected to one another, lie at an angle with respect to a plane which lies at right angles to the optical axis.

* * * * *

UNITED STATES PATENT AND TRADEMARK OFFICE
CERTIFICATE OF CORRECTION

PATENT NO. : 6,829,107 B2
APPLICATION NO. : 09/882564
DATED : December 7, 2004
INVENTOR(S) : Karlfrid Osterried It is certified that error appears in the above-identified patent and that said Letters Patent is hereby corrected as shown below:

Col. 1, line 37, -
  Replace "reinstallation takes place, no new errors Iran arise or a"
  With --reinstallation takes place, no new errors can arise or a--

Col. 2, line 13 -
  Replace "tilted The resolution can be set by selecting the angle of"
  With --tilted. The resolution can be set by selecting the angle of--

Col. 2, line 67 -
  Replace "angle a with respect to the horizontal plane;"
  With --angle α with respect to the horizontal plane;--

Col. 3, line 3 –
  Replace "FIG. 8 shows excepts or a side view of the tilting"
  With --FIG. 8 shows excerpts of a side view of the tilting--

Col. 3, line 21 –
  Replace "thereto, The adapter ring 4 is in turn connected via screws to"
  With --thereto. The adapter ring 4 is in turn connected via screws to--

Col. 3, line 23 –
  Replace "The lens element is provided with a widened edge zone 5"
  With --The lens element 1 is provided with a widened edge zone 5--

Col. 3, line 37 –
  Replace "element is exactly positioned, so that after removal has taken"
  With --element 1 is exactly positioned, so that after removal has taken--

Col. 3, line 49
  Replace "be necessary per se For safety reasons, however, it is"
  With --be necessary per se. For safety reasons, however, it is--

Col. 4, line 8 –
  Replace "Supper flat surface 7 and/or in the lower flat surface 6. The"
  With --upper flat surface 7 and/or in the lower flat surface 6. The--

Col. 4, line 12 –
  Replace "and 10 are located. The relief grooves 16 may extend in toe"
  With --and 10 are located. The relief grooves 16 may extend in the--

UNITED STATES PATENT AND TRADEMARK OFFICE
CERTIFICATE OF CORRECTION

PATENT NO. : 6,829,107 B2
APPLICATION NO. : 09/882564
DATED : December 7, 2004
INVENTOR(S) : Karlfrid Osterried It is certified that error appears in the above-identified patent and that said Letters Patent is hereby corrected as shown below:

Col. 4, line 29 –
  Replace "The support points 6, 9 and 10 can be milled and"
  With --The support points 8, 9 and 10 can be milled and--

Col. 4, line 57 -
  Replace "adjustment. As Wan be seen from FIG. 7, in this case the"
  With --adjustment. As can be seen from FIG. 7, in this case the--

Col. 4, line 67 -
  Replace "element 1, reestablished."
  With --element 1, are established.--

Col. 5, line 4 -
  Replace "to the z axes, which in the present case represent the"
  With --to the z axes, which in the present case represents the--

Col. 5, line 9 –
  Replace "points 11, the direction of the arrow A, along the slope, once"
  With -- points 11, in the direction of the arrow A, along the slope, once--

Col. 5, line 12–
  Replace "tilting adjustment of the support points for the tens element"
  With -- tilting adjustment of the support points for the lens element--

Col. 5, line 16 –
  Replace "points 12 via an intermediate web 18. Naturally, the bearing"
  With -- points 11 via an intermediate web 18. Naturally, the bearing--

UNITED STATES PATENT AND TRADEMARK OFFICE
CERTIFICATE OF CORRECTION

PATENT NO. : 6,829,107 B2
APPLICATION NO. : 09/882564
DATED : December 7, 2004
INVENTOR(S) : Karlfrid Osterried It is certified that error appears in the above-identified patent and that said Letters Patent is hereby corrected as shown below:

Col. 5, line 17 -
Replace "of the bearing bodies 12 on the counterbearing points it may"
With -- of the bearing bodies 12 on the counterbearing points 11 may--

Signed and Sealed this

Twenty-third Day of January, 2007

JON W. DUDAS
*Director of the United States Patent and Trademark Office*